(12) United States Patent
Okano (10) Patent No.: US 11,032,907 B2
(45) Date of Patent: Jun. 8, 2021

(54) MANUFACTURING METHOD FOR ELECTRONIC APPARATUS WITH CASE IN WHICH PRINTED BOARDS JOINED TO EACH OTHER ARE STORED

(71) Applicant: SHINDENGEN ELECTRIC MANUFACTURING CO., LTD., Chiyoda-ku (JP)

(72) Inventor: Toshifumi Okano, Hanno (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 275 days.

(21) Appl. No.: 16/094,369

(22) PCT Filed: May 23, 2016

(86) PCT No.: PCT/JP2016/065133
§ 371 (c)(1),
(2) Date: Oct. 17, 2018

(87) PCT Pub. No.: WO2017/203559
PCT Pub. Date: Nov. 30, 2017

(65) Prior Publication Data
US 2019/0150282 A1   May 16, 2019

(51) Int. Cl.
*H05K 1/14* (2006.01)
*H05K 5/00* (2006.01)
(Continued)

(52) U.S. Cl.
CPC ............ *H05K 1/144* (2013.01); *H05K 1/14* (2013.01); *H05K 1/141* (2013.01); *H05K 1/181* (2013.01);
(Continued)

(58) Field of Classification Search
CPC ........ H05K 1/0271; H05K 1/14; H05K 1/141; H05K 1/144; H05K 1/181; H05K 2201/09172; H05K 3/36; H05K 3/368
See application file for complete search history.

(56) References Cited

U.S. PATENT DOCUMENTS 4,538,865 A * 9/1985 Wakabayashi ......... H05K 3/365
439/493
4,795,079 A    1/1989 Yamada
(Continued)

FOREIGN PATENT DOCUMENTS

JP    48-61961 A    8/1973
JP    55-83292 A    6/1980
(Continued)

OTHER PUBLICATIONS

Extended European Search Report dated May 10, 2019 in Patent Application No. 16903041.8, citing documents AA and AB therein, 5 pages.
(Continued)

*Primary Examiner* — Minh N Trinh
(74) *Attorney, Agent, or Firm* — Oblon, McClelland, Maier & Neustadt, L.L.P.

(57) ABSTRACT

A printed board joining method according to an embodiment includes preparing a printed board having, on an upper surface, a plurality of connection land portions provided along a side end, preparing a printed board having, on a lower surface, a plurality of connection land portions along a side end, and joining the printed board and the printed board together with a conductive joining material such that the upper surface is opposed to the lower surface and the plurality of connection land portions are electrically connected to the corresponding connection land portions. One or more cutout portions are provided between the plurality
(Continued)

of connection land portions and/or between the plurality of connection land portions.

2 Claims, 5 Drawing Sheets

(51) Int. Cl.
*H05K 3/36* (2006.01)
*H05K 1/18* (2006.01)
*H05K 5/03* (2006.01)
*H05K 1/02* (2006.01)

(52) U.S. Cl.
CPC .............. *H05K 3/36* (2013.01); *H05K 3/368* (2013.01); *H05K 5/0039* (2013.01); *H05K 5/0056* (2013.01); *H05K 5/03* (2013.01); *H05K 1/0271* (2013.01); *H05K 2201/09172* (2013.01)

(56) References Cited

U.S. PATENT DOCUMENTS

| | | | |
|---|---|---|---|
| 4,950,527 A | 8/1990 | Yamada | |
| 7,223,105 B2* | 5/2007 | Weiss | H01R 13/2414 439/497 |
| 9,095,069 B2* | 7/2015 | Stefanoff | H05K 3/403 |
| 9,795,025 B2* | 10/2017 | Sebanz | H05K 1/02 |
| 2005/0248010 A1 | 11/2005 | Ono et al. | |
| 2006/0170663 A1 | 8/2006 | Mouri et al. | |
| 2009/0044969 A1* | 2/2009 | Ishii | H05K 3/363 174/255 |
| 2009/0103275 A1 | 4/2009 | Sakamoto et al. | |
| 2019/0150282 A1* | 5/2019 | Okano | H05K 1/144 361/760 |

FOREIGN PATENT DOCUMENTS

| | | |
|---|---|---|
| JP | 57-163968 A | 10/1982 |
| JP | 61-162074 U | 10/1986 |
| JP | 61-183562 U | 11/1986 |
| JP | 62-116580 U | 7/1987 |
| JP | 8-78839 A | 3/1996 |
| JP | 11-103145 A | 4/1999 |
| JP | 2004-172360 A | 6/2004 |
| JP | 2006-210849 A | 8/2006 |
| JP | 2010-177359 A | 8/2010 |
| WO | WO 2016/059699 A1 | 4/2016 |

OTHER PUBLICATIONS

International Search Report dated Jun. 28, 2016, in PCT/JP2016/065133, filed May 23, 2016.

International Preliminary Report on Patentability dated Nov. 29, 2018 in PCT/JP2016/065133 (submitting English translation only), citing document AO therein, 9 pages.

* cited by examiner

MANUFACTURING METHOD FOR ELECTRONIC APPARATUS WITH CASE IN WHICH PRINTED BOARDS JOINED TO EACH OTHER ARE STORED

TECHNICAL FIELD

The present invention relates to a printed board joining method, an electronic apparatus, and a manufacturing method therefor.

BACKGROUND ART

In vehicles such as motorcycles and automobiles, switching regulators for charging batteries are installed. Such a switching regulator converts alternating current power outputted from an alternating current generator (ACG) into direct current power, and outputs the direct current power to a battery. Electronic components including not only a semiconductor switching element (e.g. MOSFET) constituting a power converting circuit, but also a smoothing capacitor, a diode, and a control IC for controlling the semiconductor switching element are used for the switching regulator. These electronic components are mounted on a printed board, such as an aluminum board, having an excellent heat radiation property.

Note that Patent Literature 1 discloses a circuit board formed by directly joining two printed boards together with solder.

CITATION LIST

Patent Literature

Patent Document 1: Japanese Patent Laid-Open No. 11-103145

SUMMARY OF INVENTION

Technical Problem

Meanwhile, in order to improve the noise resistance of a switching regulator, a control IC for controlling a semiconductor switching element is desirably mounted on a printed board separated from a printed board on which heat generating components such as a semiconductor switching element and a diode are mounted.

However, in the case where two printed boards are directly joined together with solder as in Patent Literature 1, one of the printed boards may be warped in a high-temperature environment such as an environment in a reflow process or in use, due to, for example, the difference in linear expansion coefficient between the printed boards. In this case, a solder crack, etc. Is generated, whereby a problem arises that the reliability of electric connection between the printed boards is deteriorated.

In order to avoid the aforementioned problem, in a conventional method, two printed boards, instead of being directly jointed with each other, are arranged vertically and are electrically connected to each other with a connection terminal (connection pin). However, the case of using a connection terminal, causes a problem that the cost is increased or reduction of the product height becomes difficult.

Therefore, an object of the present invention is to provide a printed board joining method, an electronic apparatus, and a manufacturing method for the electronic apparatus, in which two printed boards can be directly joined together without involving deterioration of the reliability of electric connection therebetween.

Solution to Problem

A printed board joining method according to the present invention is characterized by including
preparing a first printed board having a first main surface and a second main surface opposite to the first main surface, the first printed board having, on the first main surface, a plurality of first connection land portions provided along a side end of the first printed board,
preparing a second printed board having a third main surface and a fourth main surface opposite to the third main surface, the second printed board having, on the fourth main surface, a plurality of second connection land portions provided along a side end of the second printed board, and
joining the first printed board and the second printed board together with a conductive joining material such that the first main surface is opposed to the fourth main surface and the plurality of first connection land portions are electrically connected to the corresponding second connection land portions, wherein
one or more cutout portions are provided between the plurality of first connection land portions and/or between the plurality of second connection land portions.

Further, in the printed board joining method,
the cutout portions may be provided between the plurality of first connection land portions and between the plurality of second connection land portions, and
in the joining, the first printed board and the second printed board may be joined together such that the cutout portion of the first printed board and the cutout portion of the second printed board at least partially overlap with each other to form a penetrating hole.

An electronic apparatus according to the present invention is characterized by including
a first printed board having a first main surface and a second main surface opposite to the first main surface, and
a second printed board having a third main surface and a fourth main surface opposite to the third main surface,
the first main surface having thereon a plurality of first connection land portions provided along a side end of the first printed board, the fourth main surface having thereon a plurality of second connection land portions provided along a side end of the second printed board, one or more cutout portions being provided between the plurality of first connection land portions and/or between the plurality of second connection land portions,
the first printed board and the second printed board being joined together with a conductive joining material such that the first main surface is opposed to the fourth main surface and the plurality of first connection land portions are electrically connected to the corresponding second connection land portions.

Further, in the electronic apparatus,
through holes that electrically connect the second connection land portions and a wiring pattern formed on the third main surface, may be provided in the second printed board, and the cutout portion of the second printed board may intersect a straight line connecting the adjacent through holes.

Further, in the electronic apparatus,
the first printed board may be an aluminum board or a ceramic board, and the second printed board may be a glass epoxy board.

Further, the electronic apparatus may further include a case which is upwardly open, and has a first bottom surface and a second bottom surface disposed deeper than the first bottom surface, wherein the first printed board may be stored in the case such that the second main surface is in contact with the first bottom surface, and the second printed board is stored in the case so as to be located above the second bottom.

Further, in the electronic apparatus, the cutout portion of the first printed board and the cutout portion of the second printed board may at least partially overlap with each other to constitute a penetrating hole, and the penetrating hole may communicate with a space defined by the case and the second printed board.

Further, in the electronic apparatus, the first bottom surface and the second bottom surface may be connected via an inclined surface, and at least a part of the penetrating hole may be located above the inclined surface.

Further, the electronic apparatus may further include a cover plate that closes the opening in an upper portion of the case, and a sealing portion that fills a storage space defined by the case and the cover plate and seals the first and second printed boards stored in the case.

Further, in the electronic apparatus, the sealing portion may be made from a hard epoxy resin.

Further, in the electronic apparatus, a through hole that electrically connects the second connection land portion and a wiring pattern formed on the third main surface may be provided in the second printed board, and, through the through hole, a first electronic component mounted on the first main surface and a second electronic component mounted on the third main surface may be electrically connected.

Further, in the electronic apparatus, the first electronic component may be a semiconductor switching element constituting a power converting circuit that coverts alternating current power inputted thereto to direct current power, and the second electronic component may be a control IC that performs ON/OFF control of the semiconductor switching element.

A manufacturing method for an electronic apparatus according to the present invention includes preparing a first printed board having a first main surface and a second main surface opposite to the first main surface, the first printed board having, on the first main surface, a plurality of first connection land portions provided along a side end of the first printed board, a cutout portion being provided between the plurality of first connection land portions, preparing a second printed board having a third main surface and a fourth main surface opposite to the third main surface, the second printed board having, on the fourth main surface, a plurality of second connection land portions provided along a side end of the second printed board, a cutout portion being provided between the plurality of second connection land portions, joining the first printed board and the second printed board together with a conductive joining material such that the first main surface is opposed to the fourth main surface and the plurality of first connection land portions are electrically connected to the corresponding second connection land portions, preparing a case which is upwardly open, and has a first bottom surface and a second bottom surface disposed deeper than the first bottom surface, storing the joined first and second printed boards in the case such that the second main surface of the first printed board is in contact with the first bottom surface and the second printed board is located above the second bottom surface, closing the opening in an upper portion of the case with a cover plate, and sealing the first and second printed boards stored in the case by injecting a sealing resin into a storage space defined by the case and the cover plate.

Further, in the manufacturing method for an electronic apparatus, in the joining, the first printed board and the second printed board may be joined together such that the cutout portion of the first printed board and the cutout portion of the second printed board at least partially overlap with each other to form a penetrating hole, in the storing, the joined first and second printed boards may be stored in the case such that the penetrating hole communicates with a space defined by the case and the second printed board, and in the sealing, after the case may be arranged such that an opening in a side surface of the case is oriented upward, the sealing resin is injected into the space through the opening in the side surface.

Advantage Effects of Invention

Since the cutout portion(s) is provided between the connection land portions of at least either the first printed board or the second printed board, warping of the printed boards in a high-temperature environment can be suppressed. Accordingly, a stress applied to the conductive joining material can be reduced. Thus, the reliability of electric connection between two printed boards can be prevented from deteriorating even when the printed boards are directly joined together with a conductive joining material.

Therefore, according to the present invention, two printed boards can be directly joined together without involving deterioration of the reliability of electric connection therebetween.

DESCRIPTION OF EMBODIMENTS

Hereinafter, an embodiment of the present invention is described with reference to the drawings. Note that components having an equivalent function are denoted by the same reference numeral throughout the drawings.

First, a detailed description is given of a printed board 10 (first printed board) and a printed board 20 (second printed board) which are used for an electronic apparatus 1 according to the embodiment. The electronic apparatus 1 is a switching regulator (REG/RECT) that converts alternating current power outputted from an alternating current generator to direct current power and outputs the direct current power to a battery. However, the electronic apparatuses according to the present invention are not limited to switching regulators.

Figure 1:
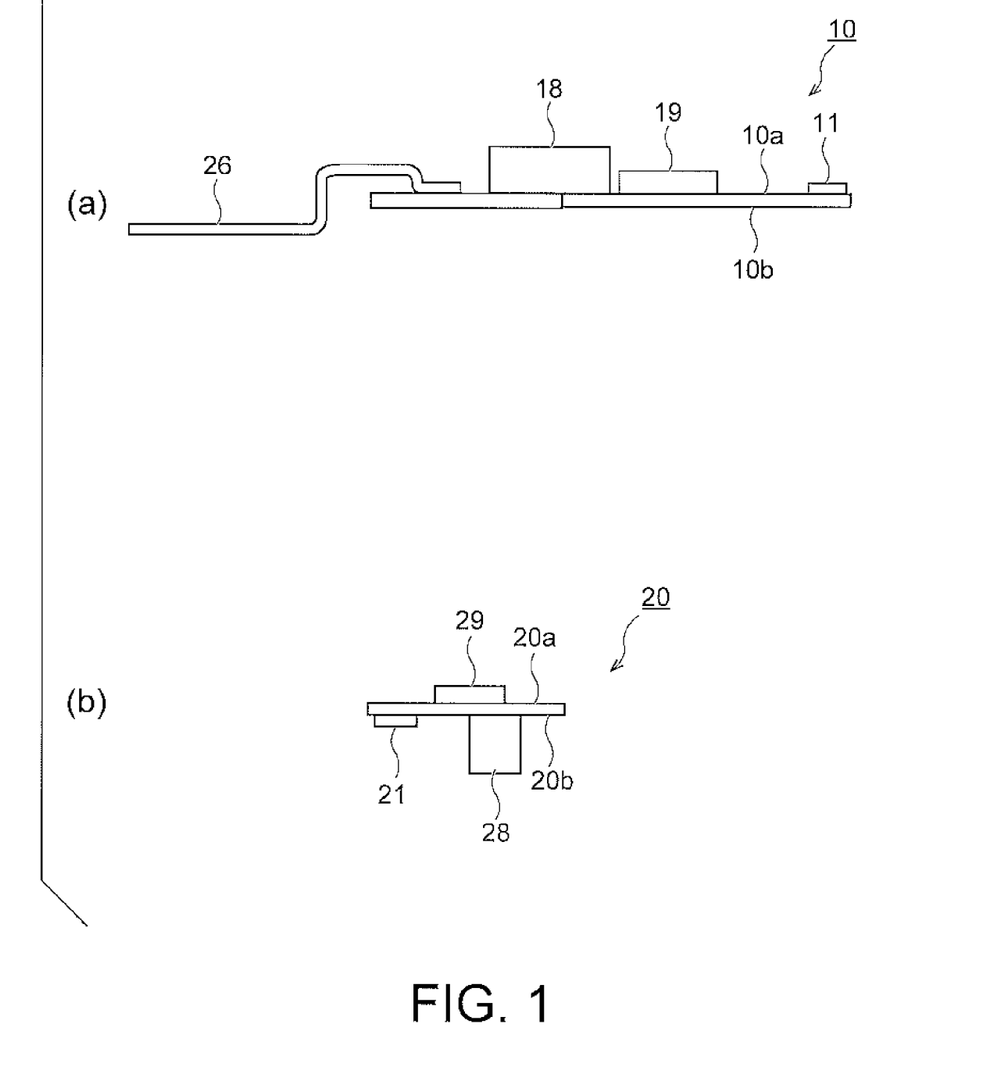
FIG. 1(a) is a side view of a printed board 10 according to an embodiment.
FIG. 1(b) is a side view of a printed board 20 according to the embodiment.

As illustrated in FIG. 1(a), the printed board 10 has an upper surface 10a (first main surface) and a lower surface 10b (second main surface) opposite to the upper surface 10a. Electronic components 18, 19 are mounted on the upper surface 10a. The electronic components 18 are diodes constituting a diode bridge. The electronic components 19 are semiconductor switching elements (e.g. MOSFET, IGBT) constituting a power converting circuit that converts alternating current power inputted thereto from an alternating current generator to direct current power. The printed board 10 is a board, such as an aluminum board or a ceramic board, having an excellent heat radiation property. However, the printed board 10 is not limited thereto, and may be a glass epoxy board or the like.

Note that, in the present embodiment, the lower surface 10b of the printed board 10 functions as a heat radiation surface for radiating heat generated from heat generating components such as the diodes and the semiconductor switching elements. For this reason, no electronic component is mounted on the lower surface 10b.

Figure 2:
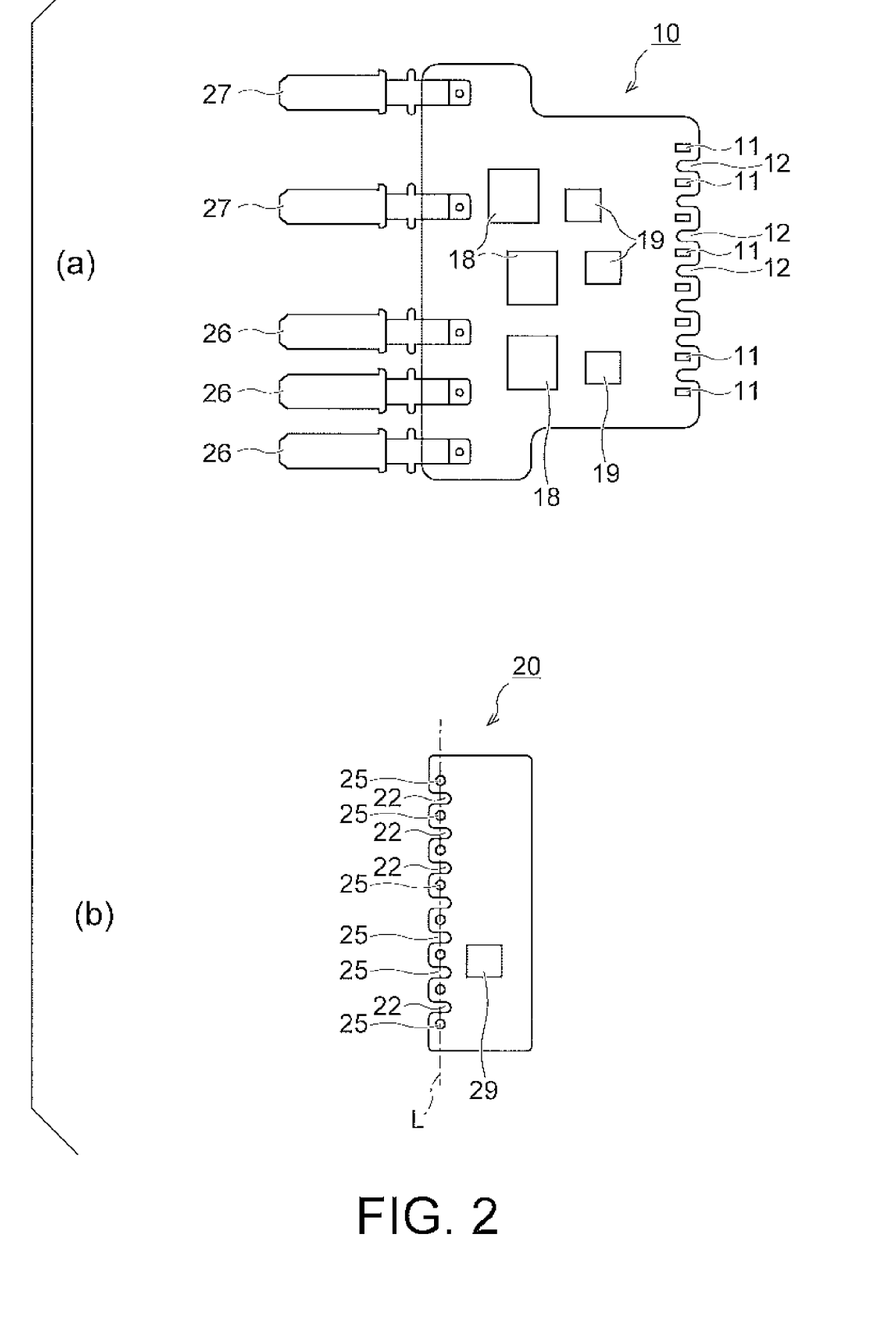
FIG. 2(a) is a plan view of the printed board 10 according to the embodiment.
FIG. 2(b) is a plan view of the printed board 20 according to the embodiment.
Figure 4:
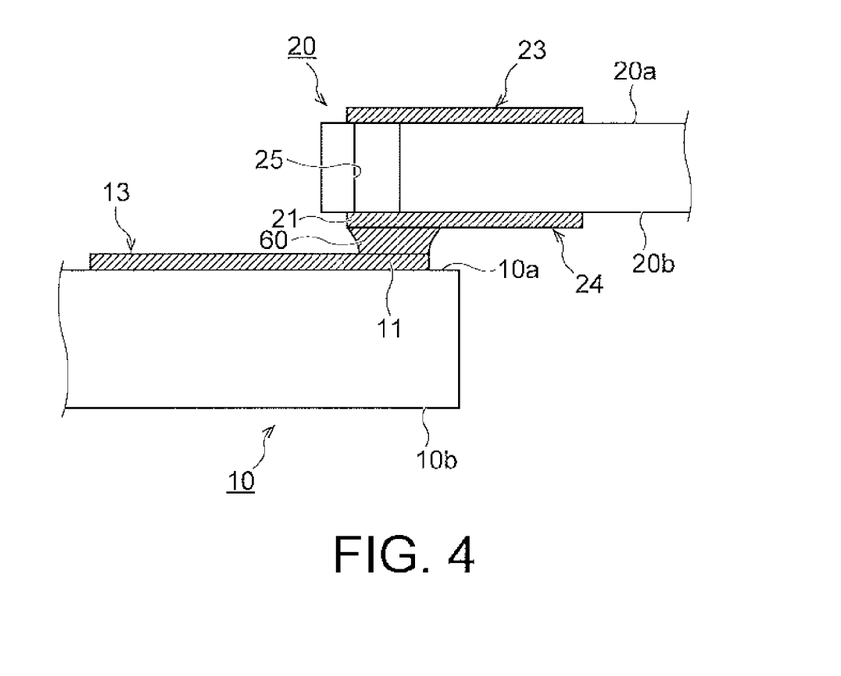
FIG. 4 is a partial side view of an enlarged portion of a direct joint of the printed board 10 and the printed board 20.

As illustrated in FIGS. 1(a) and 2(a), the upper surface 10a has a plurality of connection land portions 11 (first connection land portions) provided along a side end of the printed board 10. Further, a plurality of cutout portions 12 are provided between the plurality of connection land portions 11. The size or shape of each of the cutout portions 12 is not limited to a particular size or shape. Note that, in the present embodiment, the connection land portions 11 are formed as a part of a wiring pattern 13 formed on the upper surface 10a as illustrated in FIG. 4.

As illustrated in FIG. 2(a), three bus bars 26 and two bus bars 27 are provided to the printed board 10. The bus bars 26 are terminals for receiving inputs of three-phase alternating current power generated by an alternating current power generator (ACG). The two bus bars are terminals for outputting direct current power obtained as a result of power conversion. In the present embodiment, the bus bars 26, 27 are provided so as to extend to the outside from a side end of the printed board 10 opposite to the side end on which the plurality of connection land portions 11 are provided.

As illustrated in FIG. 1(b), the printed board 20 has an upper surface 20a (third main surface) and a lower surface 20b (fourth main surface) opposite to the upper surface 20a. An electronic component 29 is mounted on the upper surface 20a, and an electronic component 28 is mounted on the lower surface 20b. The electronic component 28 is a smoothing capacitor, and the electronic component 29 is a control IC for performing ON/OFF control of the semiconductor switching elements. The printed board 20 is a glass epoxy board, for example. The control IC is mounted on the glass epoxy board so that the influence of noise can be further reduced, compared to a case where the control IC is mounted on a metallic board such as an aluminum board. Thus, a malfunction and the like can be suppressed.

As illustrated in FIG. 1(b), the lower surface 20b of the printed board 20 has connection land portions 21 (second connection land portions) provided thereon. As illustrated in FIG. 4, each of the connection land portions 21 is provided directly under a through hole 25. Thus, the lower surface 20b of the printed board 20 has a plurality of the connection land portions 21 (second connection land portions) provided along a side end of the printed board 20. Note that, in the present embodiment, the connection land portions 21 are formed as a part of a wiring pattern 24 formed on the lower surface 20b, as illustrated in FIG. 4.

As illustrated in FIG. 4, the through holes 25 electrically connect the connection land portions 21 and the wiring pattern 23 formed on the upper surface 20a. Through the through holes 25, the electronic components 19 and the electronic component 29 are electrically connected.

As illustrated in FIG. 2(b), a plurality of cutout portions 22 are provided between the plurality of connection land portions 21 (through holes 25) of the printed board 20. The size or shape of each of the cutout portions 22 is not limited to a particular size or shape. For example, as illustrated in FIG. 2(b), the cutout portions 22 are formed to be deep enough to intersect a straight line L connecting the adjacent through holes 25. Accordingly, warping of the printed board 20 when being heated can be further suppressed.

Next, a description is given of a method for joining the printed board 10 and the printed board 20 together. First, the aforementioned printed board 10 and the aforementioned printed board 20 are prepared.

Figure 3:
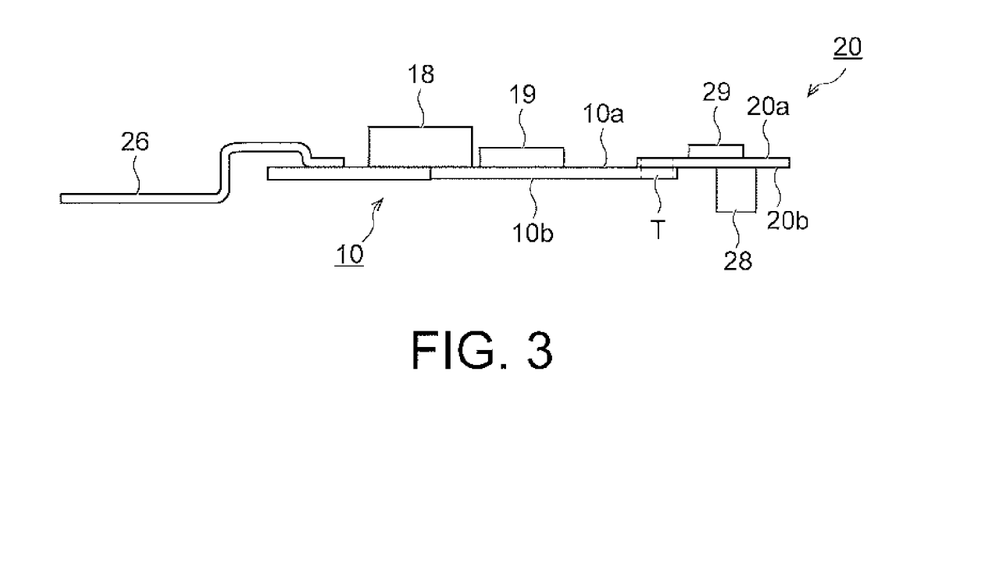
FIG. 3 is a side view of the printed board 10 and the printed board 20 in a state of being directly joined together.

Next, the printed board 10 and the printed board 20 are joined together with a conductive joining material 60 (a joining step) such that the upper surface 10a of the printed board 10 is opposed to the lower surface 20b of the printed board 20 and the plurality of connection land portions 11 are electrically connected to the corresponding connection land portions 21, as illustrated in FIG. 3 and FIG. 4. In the joining step, the printed board 10 and the printed board 20 are heated, but warping of the printed board 10 and warping of the printed board 20 are suppressed because the cutout portions 12 and the cutout portions 22 are provided.

The conductive joining material 60 is cream solder, for example, and is applied to the connection land portions 11 prior to the joining step. Note that the conductive joining material 60 only needs to be a conductive joining material which is cured by being heated, and is not limited to solder. For example, a conductive paste such as a silver paste, or a conductive adhesive obtained by dispersing conductive nanoparticles into an adhesive may be used as the conductive joining material 60. Note that, prior to the joining step, the electronic components 18, 19, 28, 29 and the bus bars 26, 27 are placed on the cream solder applied to prescribed positions on the printed boards 10, 20.

Note that, in the joining step, the printed board 10 and the printed board 20 may be joined together such that the cutout portions 12 of the printed board 10 and the cutout portions 22 of the printed board 20 at least partially overlap with each other to form penetrating holes T, as illustrated in FIG. 3. Accordingly, the conductive joining material 60 can be inhibited from extending over the connection land portions (e.g. generation of a solder bridge can be inhibited). In addition, when the printed board 10 and the printed board 20 are sealed with resin, the penetrating holes T can function as air-bubble releasing holes, and the details of this function are described below in an explanation of the manufacturing method of the electronic apparatus 1.

Figure 5:
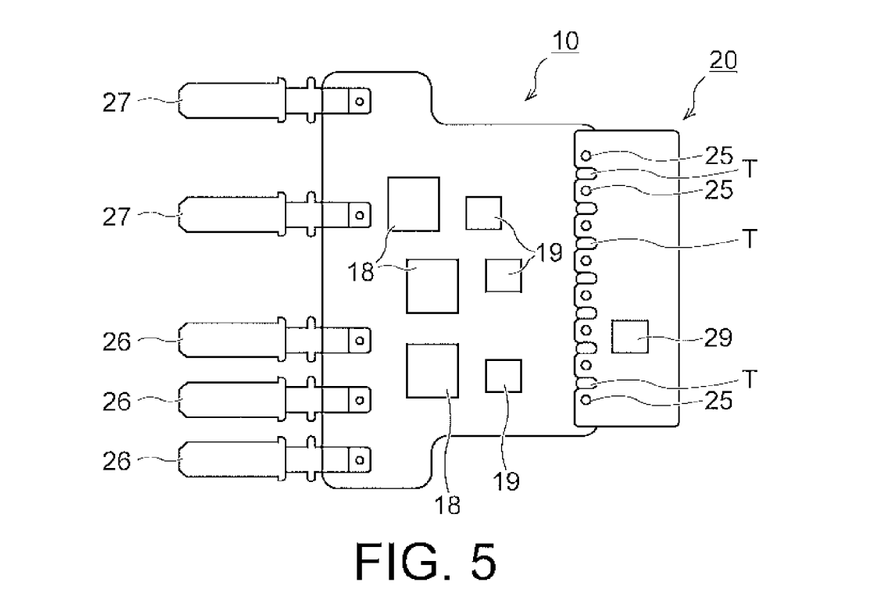
FIG. 5 is a plan view of the printed board 10 and the printed board 20 in the state of being directly joined together.

As described above, the electronic apparatus 1 (directly joined printed boards) in which the printed board 10 and the printed board 20 are directly joined together, as illustrated in FIGS. 3 to 5, can be obtained.

In the printed board joining method according to the present embodiment, warping of the printed boards 10, 20 in a high-temperature environment can be suppressed because the cutout portions 12 are provided between the connection land portions 11 of the printed board 10, the cutout portions 22 are provided between the connection land portions 21 of the printed board 20. Accordingly, a stress applied to the conductive joining material 60 can be reduced. Thus, even when the two printed boards 10, 20 are directly joined together with the conductive joining material 60, the reliability of electric connection between the printed boards 10, 20 can be prevented from deteriorating.

Consequently, according to the present embodiment, the two printed boards 10, 20 can be directly joined together without involving deterioration of the reliability of electric connection therebetween. As a result, the yield and the reliability can be improved. Moreover, reduction of the height of the electronic apparatus 1 can be achieved.

Furthermore, since the cutout portions 12, 22 are provided, a worker can visually check, with ease, whether a bridge (e.g. solder bridge) of the conductive joining material 60 is generated.

Note that the cutout portions are provided on both the printed board 10 and the printed board 20 in the above embodiment, but may be provided on only either the printed board 10 or the printed board 20. For example, the cutout portions are provided on only the printed board having a greater linear expansion coefficient. Also, a plurality of the cutout portions are provided in the above embodiment, but only one cutout portion may be provided on a printed board. In this case, the cutout portion is preferably provided on the center portion of a side end of the printed board.

<Electronic Apparatus 1>

Next, a description is given of the electronic apparatus 1 according to the embodiment.

The electronic apparatus 1 includes the printed board 10 and the printed board 20 directly joined together by the aforementioned joining method. The printed board 10 and the printed board 20 are joined together with the conductive joining material 60 such that the upper surface 10*a* of the printed board 10 is opposed to the lower surface 20*b* of the printed board 20 and the plurality of connection land portions 11 provided on the printed board 10 are electrically connected to the corresponding connection land portions 21, as illustrated in FIGS. 3 and 4.

Figure 7:
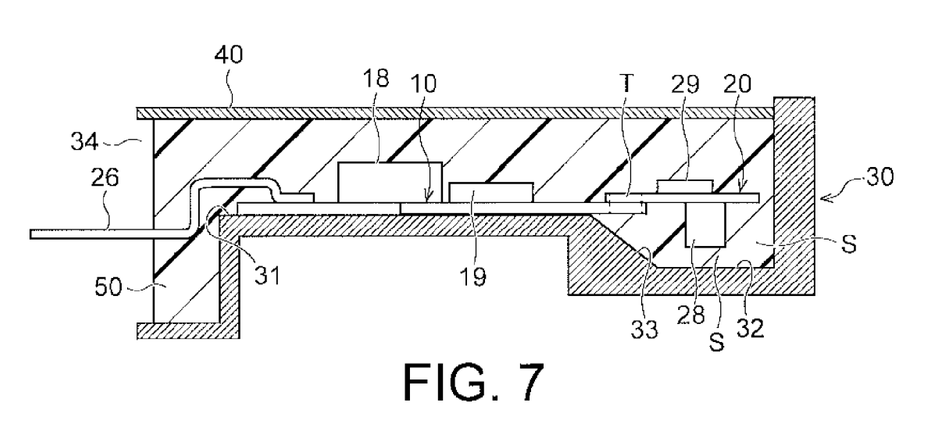
FIG. 7 is a cross-sectional view of the electronic apparatus 1 according to the embodiment.

The electronic apparatus 1 further includes a case 30 which is upwardly open, a cover plate 40 for the case 30, and a sealing portion 50 filling the case 30, as illustrated in FIG. 7. Note that a housing (socket), which is not illustrated in FIG. 7, for housing the bus bar 26,27 may be provided.

Figure 6:
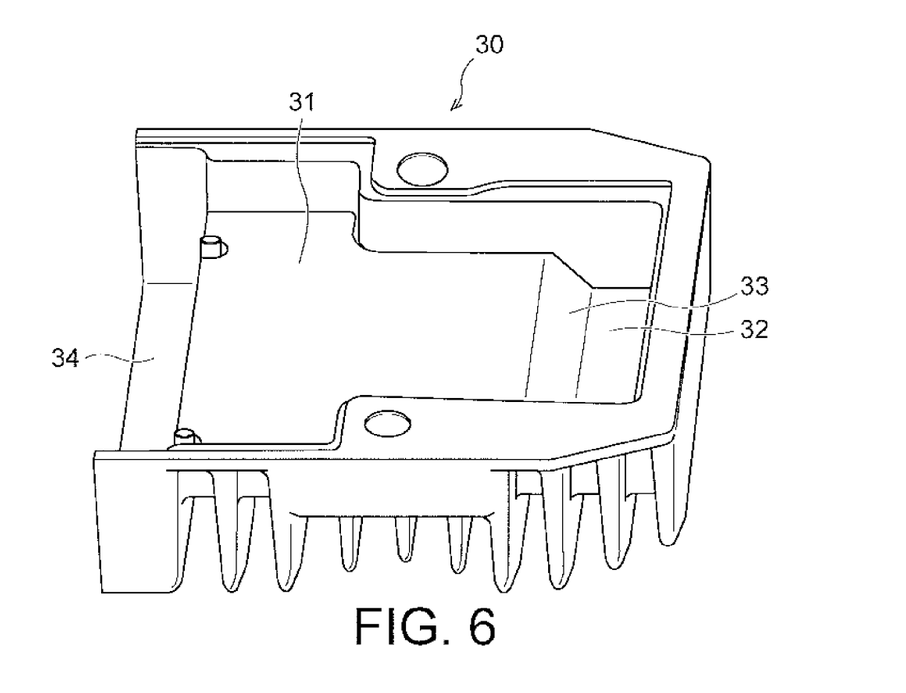
FIG. 6 is a perspective view of a case 30 for use in an electronic apparatus 1 according to the embodiment.

The case 30 has a bottom surface 31 (first bottom surface) and a bottom surface 32 (second bottom surface) disposed deeper than the bottom surface 31, as illustrated in FIG. 6. The bottom surface 31 and the bottom surface 32 are connected via an inclined surface 33. An opening 34 through which the bus bars 26, 27 protrude from the case 30 is provided in the left side of the case 30. Note that the material of the case 30 preferably has high thermal conductivity. The material is metal such as aluminum, for example.

The cover plate 40 closes the opening in the upper portion of the case 30. A storage space for storing the printed boards 10, 20 are defined by the case 30 and the cover plate 40.

As illustrated in FIG. 7, the printed board 10 and the printed board 20 are stored in the case 30. More specifically, the printed board 10 is stored in the case 30 such that the lower surface 10*b* (heat radiation surface) is in contact with the bottom surface 31, and the printed board 20 is stored in the case 30 so as to be located above the bottom surface 32.

As illustrated in FIG. 7, the cutout portions 12 of the printed board 10 and the cutout portions 22 of the printed board 20 at least partially overlap with each other to form the penetrating holes T. The penetrating holes T communicate with a space S defined by the case 30 and the printed board 20. Note that the penetrating holes T may be located above the inclined surface 33, as illustrated in FIG. 7. Accordingly, when the printed board 10 and the printed board 20 are sealed with resin, releasing of air bubbles retained in the space S to the upper surface side of the printed boards 10, 20 can be facilitated through the penetrating holes T. Note that only some of the penetrating holes T may be located above the inclined surface 33. Also, the boundary between the bottom surface 31 and the inclined surface 33 is preferably exposed from the penetrating holes T.

The sealing portion 50 fills a storage space defined by the case 30 and the cover plate 40. The sealing portion 50 seals the printed boards 10, 20 stored in the case 30. Note that the sealing portion 50 is made from a hard epoxy resin, for example. In order to prevent occurrence of a crack (e.g. solder crack) in the conductive joining material 60, the sealing portion 50 is preferably made from a hard resin.

<Manufacturing Method for Electronic Apparatus 1>

A detailed description is given of a manufacturing method for the electronic apparatus 1. First, the two printed boards 10, 20 directly joined together by the aforementioned joining method and the case 30 are prepared. Note that, in the joining method of the printed board 10 and the printed board 20, the printed board 10 and the printed board 20 are joined together such that the cutout portions 12 of the printed board 10 and the cutout portions 22 of the printed board 20 at least partially overlap with each other to form the penetrating holes T.

Next, the directly joined printed board 10 and printed board 20 is stored in the case 30 (storage step) such that the lower surface (heat radiation surface) 10*b* of the printed board 10 is in contact with the bottom surface 31 and the printed board 20 is located above the bottom surface 32, as illustrated in FIG. 7. In this step, the printed board 10 and the printed board 20 are stored in the case 30 such that the penetrating holes T communicate with the space S defined by the case 30 and the printed board 20.

Next, the opening in the upper portion of the case 30 is closed by the cover plate 40 (closing step). Specifically, the cover plate 40 is fixed to the case 30 with an adhesive or a screw, etc., so as to close the opening in the upper portion of the case 30.

Figure 8:
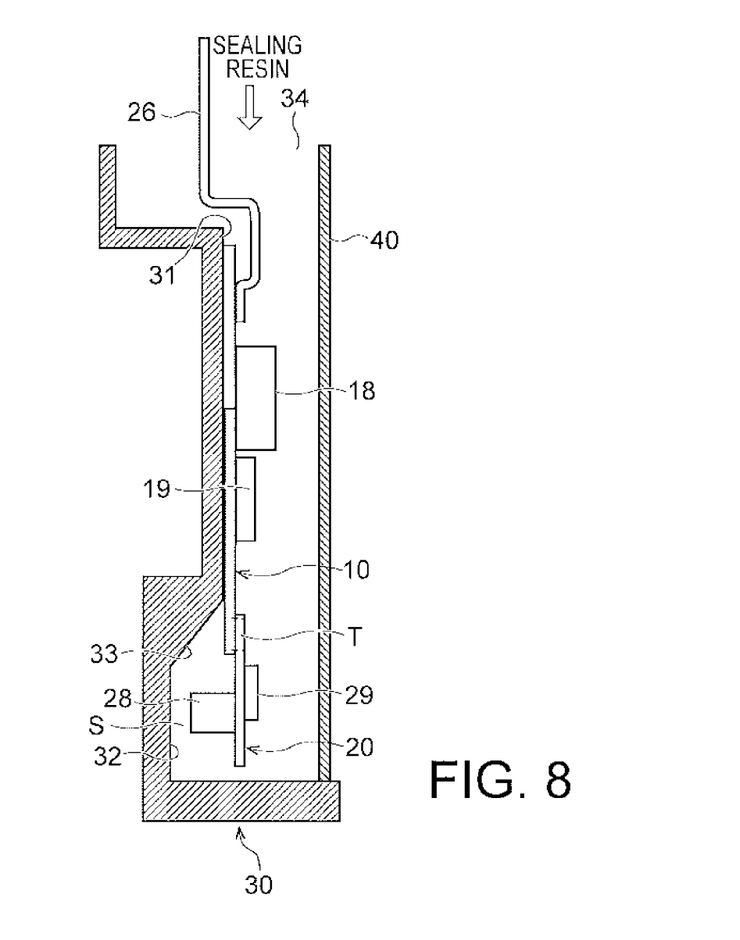
FIG. 8 is a cross-sectional view for showing a manufacturing method for the electronic apparatus 1 according to the embodiment.

Next, as illustrated in FIG. 8, the case 30 is arranged such that the opening 34 in a side surface of the case 30 is oriented upward. Then, through the opening 34 in the side surface of the case 30, a sealing resin is injected into the storage space defined by the case 30 and the cover plate 40, and seal the printed board 10, 20 stored in the case 30 (sealing step). In this step, because the penetrating holes T are provided, air bubbles retained in the space S in the sealing step move upward through the penetrating holes T to the opening 34. Consequently, air bubbles can be inhibited from remaining in the space S. Through the aforementioned steps, the electronic apparatus 1 can be manufactured.

A person skilled in the art could conceive of additional effects of the present invention or various modifications thereof on the basis of the aforementioned disclosure. However, the embodiments of the present invention are not limited to the aforementioned one. Components of the difference embodiments may be combined as appropriate. Various additions, modifications, and partial deletions can be made within the scope of the conceptual ideas and gist of the present invention derived from the features specified by the claims or the equivalents thereof.

REFERENCE SIGNS LIST 1 electronic apparatus
10 printed board
10a upper surface (first main surface)
10b lower surface (second main surface)
11 connection land portion
12 cutout portion
13 wiring pattern
18, 19 electronic component
20 printed board
20a upper surface (third main surface)
20b lower surface (fourth main surface)
21 connection land portion
22 cutout portion
23, 24 wiring pattern
25 through hole
26, 27 bus bar
15 28, 29 electronic component
30 case
31, 32 bottom surface
33 inclined surface
34 opening
40 cover plate
50 sealing portion
60 conductive joining material
L straight line
S space
T penetrating hole

The invention claimed is:

1. A manufacturing method for an electronic apparatus, the method comprising:
providing a first printed board having a first main surface and a second main surface opposite to the first main surface, the first printed board having, on the first main surface, a plurality of first connection land portions provided along a side end of the first printed board, a cutout portion being provided between the plurality of first connection land portions;
providing a second printed board having a third main surface and a fourth main surface opposite to the third main surface, the second printed board having, on the fourth main surface, a plurality of second connection land portions provided along a side end of the second printed board, a cutout portion being provided between the plurality of second connection land portions;
joining the first printed board and the second printed board together with a conductive joining material such that the first main surface is opposed to the fourth main surface and the plurality of first connection land portions are electrically connected to the corresponding second connection land portions;
providing a case which is upwardly open and which has a first bottom surface and a second bottom surface disposed deeper than the first bottom surface;
storing the joined first and second printed boards in the case such that the second main surface of the first printed board is in contact with the first bottom surface and the second printed board is located above the second bottom surface;
providing a cover plate for sealing the case;
closing the opening in the upper portion of the case with the cover plate; and
sealing the first and second printed boards stored in the case by injecting a sealing resin into a storage space defined by the case and the cover plate, wherein
in the joining, the first printed board and the second printed board are joined together such that the cutout portion of the first printed board and the cutout portion of the second printed board at least partially overlap with each other to form a penetrating hole,
in the storing, the joined first and second printed boards are stored in the case such that the penetrating hole communicates with a space defined by the case and the second printed board and at least a part of the penetrating hole is located above an inclined surface connecting the first bottom surface and the second bottom surface, and
in the sealing, after the case is arranged such that an opening in a side surface of the case is oriented upward, the sealing resin is injected into the space through the opening in the side surface, thereby moving air bubbles retained in the space upward along the inclined surface to release the air bubbles to the first main surface side of the first printed board through the penetrating hole.

2. The manufacturing method for an electronic apparatus according to claim 1, wherein
a first plurality of the cutout portions are provided with the first printed board,
a second plurality of the cutout portions are provided with the second printed board, and
in the joining, the cutout portions of the first printed board overlap corresponding cutout portions of the second printed board to form a plurality of penetrating holes along a joining area where the first printed board and the second printed board are joined.

* * * * *